(12) United States Patent
Harada et al.

(10) Patent No.: US 11,066,012 B2
(45) Date of Patent: Jul. 20, 2021

(54) LIGHTING DEVICE

(71) Applicant: MITSUBA Corporation, Gunma (JP)

(72) Inventors: Yasukuni Harada, Gunma (JP); Hiroshi Abe, Gunma (JP)

(73) Assignee: MITSUBA Corporation, Gunma (JP)

( * ) Notice: Subject to any disclaimer, the term of this patent is extended or adjusted under 35 U.S.C. 154(b) by 29 days.

(21) Appl. No.: 16/105,998

(22) Filed: Aug. 21, 2018

(65) Prior Publication Data

US 2019/0054857 A1 Feb. 21, 2019

(30) Foreign Application Priority Data

Aug. 21, 2017 (JP) .............................. JP2017-158640

(51) Int. Cl.
| | |
|---|---|
| *H01H 9/00* | (2006.01) |
| *B60Q 3/80* | (2017.01) |
| *H05K 7/14* | (2006.01) |
| *H05K 1/18* | (2006.01) |
| *B60Q 3/74* | (2017.01) |
| *B60Q 3/51* | (2017.01) |
| *B60Q 3/82* | (2017.01) |
| *H05K 3/34* | (2006.01) |
| *H05K 1/02* | (2006.01) |

(52) U.S. Cl.
CPC ................. *B60Q 3/80* (2017.02); *B60Q 3/51* (2017.02); *B60Q 3/74* (2017.02); *B60Q 3/82* (2017.02); *H05K 1/181* (2013.01); *H05K 7/1427* (2013.01); *H05K 1/0271* (2013.01); *H05K 3/3447* (2013.01); *H05K 2201/10053* (2013.01); *H05K 2201/10106* (2013.01); *H05K 2201/10113* (2013.01)

(58) Field of Classification Search
CPC ... H01H 3/14; B60Q 3/74; B60Q 3/82; B60Q 3/51; B60Q 3/80
See application file for complete search history.

(56) References Cited

U.S. PATENT DOCUMENTS

| | | | |
|---|---|---|---|
| 5,272,603 A * | 12/1993 | Camarota ............ | B60Q 1/2615 362/190 |
| 5,798,912 A * | 8/1998 | Brown ................... | H01H 35/02 200/61.45 M |

(Continued)

FOREIGN PATENT DOCUMENTS

JP 2005289202 10/2005

*Primary Examiner* — Andrew J Coughlin
(74) *Attorney, Agent, or Firm* — JCIPRNET

(57) ABSTRACT

Provided is a lighting device capable of minimizing damage of a joint portion between an operation switch and a substrate or the substrate itself due to a force when the operation switch is operated and improving assemblability. The lighting device includes a housing installed in a vehicle, a substrate fixed to the housing, a cover member which is fixed to the housing and presses down the substrate, a light emitting element installed on the substrate, an operation switch which is installed on the substrate and switches the light emitting element on/off by being operated in directions of coming into contact with and moving away from the substrate, and a movement restricting portion which is formed in the housing, engages with a part of the operation switch and restricts movement of the operation switch toward the substrate side.

11 Claims, 13 Drawing Sheets

(56) References Cited

U.S. PATENT DOCUMENTS

| | | | | |
|---|---|---|---|---|
| 6,092,917 A | * | 7/2000 | Litke | F21V 3/00 |
| | | | | 362/490 |
| 2005/0207158 A1 | * | 9/2005 | Nagai | B60Q 3/82 |
| | | | | 362/249.12 |
| 2007/0053194 A1 | * | 3/2007 | Tiesler | B60Q 3/51 |
| | | | | 362/490 |
| 2011/0242832 A1 | * | 10/2011 | Maruyama | H01H 23/025 |
| | | | | 362/512 |
| 2012/0000757 A1 | * | 1/2012 | Ikeda | H01H 9/182 |
| | | | | 200/310 |

* cited by examiner

LIGHTING DEVICE

CROSS-REFERENCE TO RELATED APPLICATION

This application claims the priority of Japan patent application serial no. 2017-158640, filed on Aug. 21, 2017. The entirety of the above-mentioned patent application is hereby incorporated by reference herein and made a part of this specification.

BACKGROUND

Technical Field

The disclosure relates to a lighting device which illuminates, for example, the inside of a vehicle.

Description of Related Art

For example, a lighting device for illuminating the inside of a vehicle is provided on the ceiling of the vehicle. For example, Patent Document 1 discloses an indoor lighting device including a cold cathode tube as a light source, an operation switch for operating turning-on/off of the light source, and a substrate on which the light source and the operation switch are mounted.

[Patent Document 1] Japanese Laid-open Publication No. 2005-289202

However, in the indoor lighting device disclosed in Patent Document 1, the operation switch is mounted on the substrate. Therefore, when the operation switch is pushed, an operation force is transmitted to a joint portion between the operation switch and the substrate or the substrate via the operation switch. As a result, a load may be applied to the joint portion by solder between the operation switch and the substrate, the solder is broken, or the substrate may be bent.

In addition, the substrate is fixed to a housing of the indoor lighting device by a plurality of screws. Therefore, it takes time and labor to fix the substrate to the housing, and there is a possibility of hindering a reduction of work costs or component costs.

SUMMARY

One of the embodiments of the disclosure provides a lighting device of the disclosure includes a housing installed in a vehicle, a substrate fixed to the housing, a cover member which is fixed to the housing, sandwiches the substrate together with the housing and presses the substrate from an opposite side to the housing, a light emitting element installed on the substrate, an operation switch which is installed on the substrate to protrude toward the housing and which switches the light emitting element on/off by being operated in directions of coming into contact with and moving away from the substrate, and a movement restricting portion which is formed in the housing, engages with a part of the operation switch and restricts movement of the operation switch toward the substrate side.

DESCRIPTION OF THE EMBODIMENTS

Figure 1:
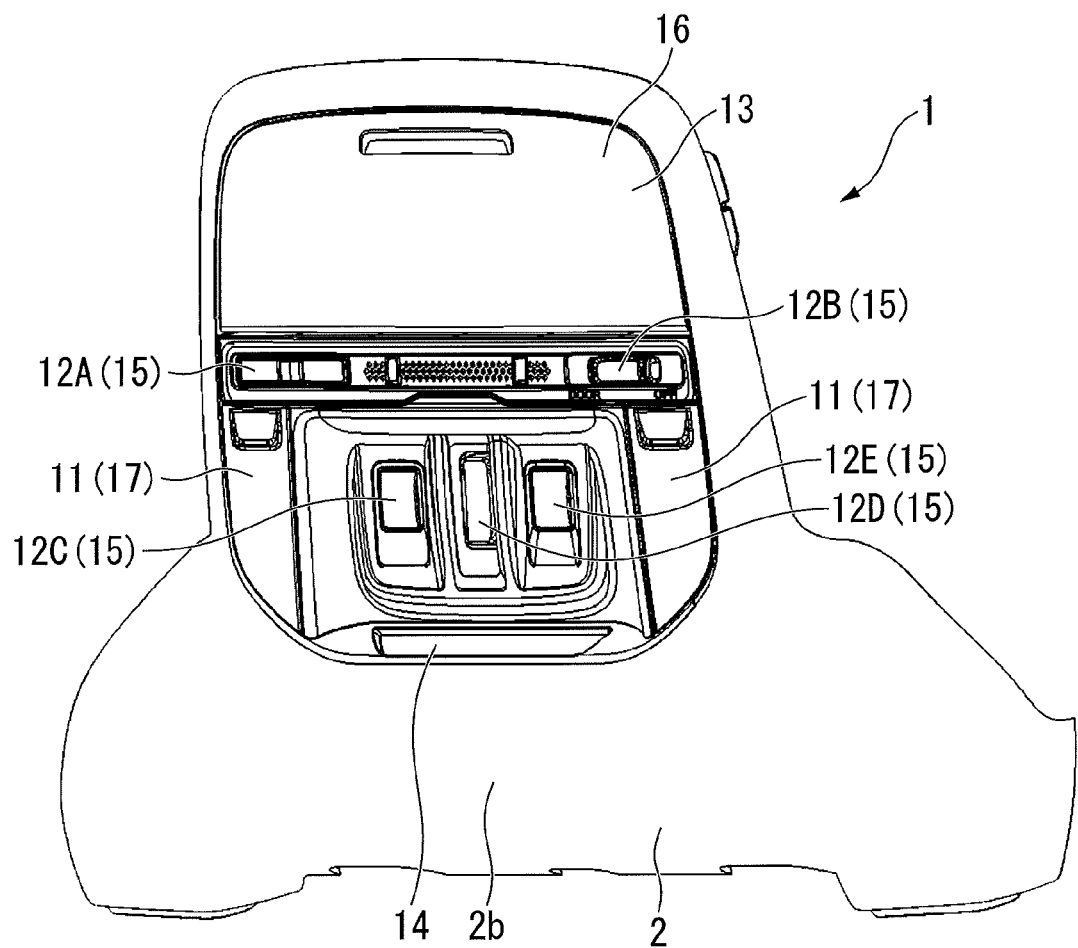
FIG. 1 a perspective view of a lighting device according to an embodiment of the disclosure.

One of the embodiments of the disclosure provides a lighting device capable of minimizing damage to a joint portion between an operation switch and a substrate or the substrate itself due to a force when the operation switch is operated and improving assemblability.

According to such a configuration, the movement restricting portion restricts the movement of the operation switch toward the substrate side. Accordingly, when the operation switch is operated in the directions of coming into contact with and moving away from the substrate to switch the light emitting element on/off, it is possible to minimize an operation force of the operation switch being transmitted to a joint portion between the operation switch and the substrate or the substrate via the operation switch. Therefore, it is possible to minimize occurrence of cracks in solder at the joint portion between the operation switch and the substrate and bending of the substrate.

Further, it is possible to minimize the number of screws for fixing the substrate to the housing of the substrate by pressing down the substrate fixed to the housing with the cover member. Therefore, it is possible to reduce labor for fixing the substrate to the housing and to reduce operation costs and component costs.

Furthermore, since the elements forming a circuit of the substrate are covered with the cover member, it is possible to prevent an operator from touching the element or dust or the like from the outside attaching to the circuit of the substrate when the lighting device is assembled to the vehicle.

Further, in the lighting device of the disclosure, the operation switch may include a body portion which is fixed to the substrate and a switch portion which is capable of being made to protrude and retract with respect to the body portion, a concave portion recessed in a direction intersecting a protruding and retracting direction of the switch portion may be provided in the body portion, and the movement restricting portion may be inserted into the concave portion.

According to such a configuration, when the movement restricting portion formed in the housing is inserted into the concave portion formed in the body portion of the operation switch, the movement restricting portion engages with a part of the operation switch to restrict the movement of the operation switch toward the substrate side. Therefore, it is possible to minimize the operation force of the operation switch being transmitted to the joint portion between the operation switch and the substrate or the substrate via the operation switch.

Further, in the lighting device of the disclosure, the movement restricting portion may include a plate-shaped portion which is formed to be parallel to the substrate and a cutout portion which is formed in the plate-shaped portion and recessed in the direction intersecting the protruding and retracting direction of the switch portion, and an inner circumferential edge of the cutout portion may be inserted into the concave portion.

According to such a configuration, the movement of the operation switch toward the substrate side is restricted by inserting the inner circumferential edge of the cutout portion into the concave portion of the body portion of the operation switch. At the time of assembly, since it is sufficient to fit the body portion of the operation switch into the cutout portion, assemblability of the lighting device can be improved.

Further, in the lighting device of the disclosure, the inner circumferential edge of the cutout portion may have an opening end which is open in the direction intersecting the protruding and retracting direction of the switch portion, and the opening end and the inner circumferential edge may be formed to be wider than an outer diameter of the concave portion of the operation switch.

According to such a configuration, the body portion of the operation switch can be easily fitted into the cutout portion by forming the opening end and the inner circumferential edge of the cutout portion to be wider than the outer diameter of the concave portion of the operation switch. Further, it is possible to minimize stress acting on the operation switch from the cutout portion in a state in which the body portion is fitted in the cutout portion. Therefore, it is possible to minimize the stress acting on the joint between the operation switch and the substrate via the operation switch.

Further, in the lighting device of the disclosure, a step portion which is recessed with respect to a surface of the plate-shaped portion may be formed along the inner circumferential edge of the cutout portion.

According to such a configuration, when the inner circumferential edge of the cutout portion is inserted into the concave portion of the operation switch, the step portion is located on the outer circumferential side of the body portion of the operation switch. Therefore, it is possible to easily visually check the installation state of the operation switch with respect to the cutout portion.

Further, the lighting device of the disclosure may further include a substrate positioning portion which is formed in the housing and comes into contact with the substrate in a direction intersecting a recessed direction of the cutout portion.

According to such a configuration, position displacement of the substrate in the direction intersecting the recessed direction of the cutout portion can be minimized by the substrate positioning portion coming into contact with the substrate. Therefore, a screw for fixing the substrate to the housing may fix the substrate only in the recessed direction of the cutout portion, and the number of screws can be reduced.

Further, in the lighting device of the disclosure, the cover member may include a convex portion which protrudes toward the substrate and comes into contact with a part of the substrate to restrict the substrate.

According to such a configuration, the number of screws for fixing the substrate to the housing can be reduced by the convex portion coming into contact with a part of the substrate, the substrate can be restrained.

Further, in the lighting device of the disclosure, the convex portion may have an inclined portion which extends in the recessed direction of the cutout portion and of which a protruding height from the cover member gradually decreases as the substrate is approached from an outer circumferential side of the substrate, and movement of the substrate in a direction in which the operation switch comes out of the cutout portion may be restrained by an outer peripheral end of the substrate coming into contact with the inclined portion.

According to such a configuration, since the outer circumferential end of the substrate comes into contact with the inclined portion of the convex portion formed on the cover member, rattling of the substrate can be minimized. In this way, it is possible to reduce the number of screws for fixing the substrate to the housing by pressing down the substrate with the cover member.

Further, in the lighting device of the disclosure, the lighting device may further include a first partition wall which is formed in the housing and provided along an outer circumferential portion of the substrate.

According to such a configuration, the first partition wall prevents the light from the light emitting element provided on the substrate from leaking from other switches, lights, or the like formed in the housing.

Further, in the lighting device of the disclosure, the lighting device may further include a second partition wall which is formed in the housing and disposed between the light emitting element provided on the substrate and the operation switch provided on the substrate.

According to such a configuration, the second partition wall can prevent a shadow from being formed by the light from the light emitting element being reflected by the operation switch or the like.

According to the disclosure, it is possible to minimize damage to the joint portion between the operation switch and the substrate or the substrate itself due to a force when the operation switch is operated and to improve assemblability.

Next, a lighting device according to an embodiment of the disclosure will be described with reference to the drawings.

FIG. 1 is a perspective view of a lighting device according to an embodiment of the disclosure.

As shown in the drawing, the lighting device 1 is mounted on a ceiling forming an upper portion of a passenger compartment of a vehicle such as an automobile. The lighting device 1 includes a housing 2 installed on the ceiling of the vehicle. A room lamp 11, various types of operation switches 12A to 12E, an accommodating portion 13 for accommodating articles, and an indicator lamp 14 for displaying various kinds of information are provided in the housing 2. The housing 2 is formed of a resin and is fixed to the ceiling of the vehicle by bolts or the like (not shown).

The operation switches 12A to 12E are operated by pushing them into the ceiling or by sliding them in a direction along the ceiling. These operation switches 12A to 12E include light emitting elements provided therein and have a switch cover 15 which is provided to cover the light emitting elements and has a light transmission property of transmitting light from the light emitting elements.

The accommodating portion 13 has a lid 16 which can be opened and closed with respect to the housing 2, and an article can be put into and taken out from an accommodating space (not shown) formed therein by opening the lid 16.

Figure 2:
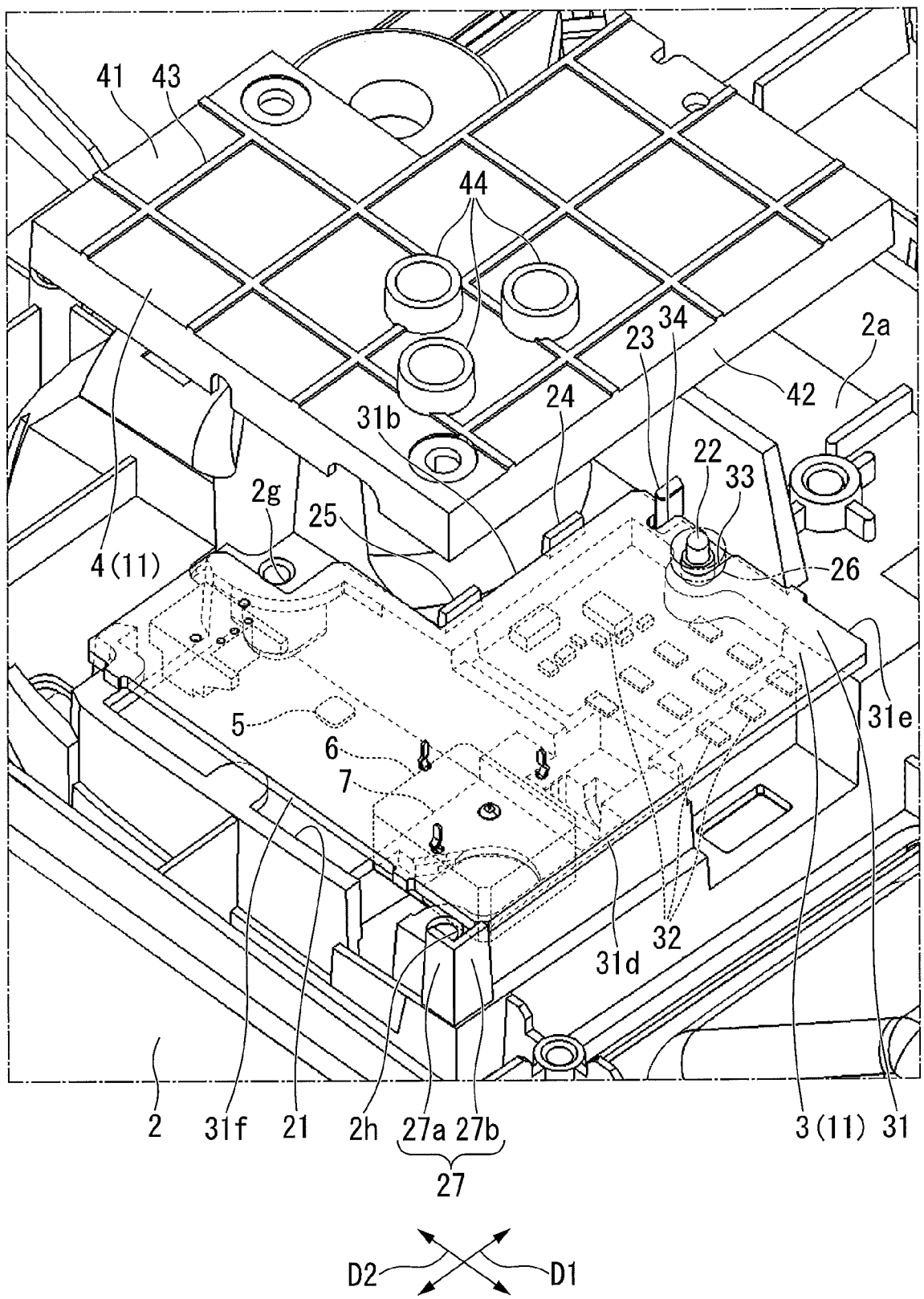
FIG. 2 is a perspective development view showing a configuration of an interior light provided in the lighting device according to the embodiment of the disclosure.
Figure 3:
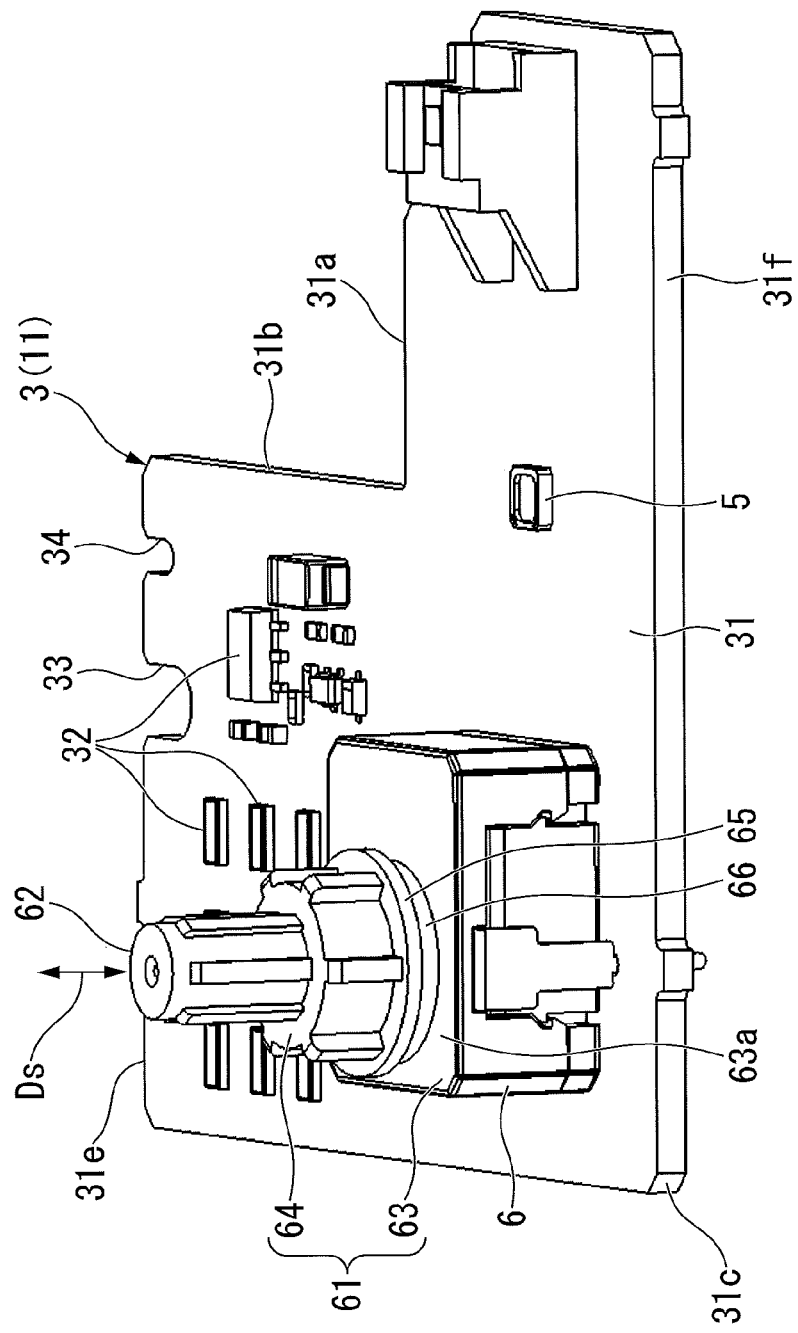
FIG. 3 is a perspective view showing a substrate forming the room lamp according to the embodiment of the disclosure.
Figure 4:
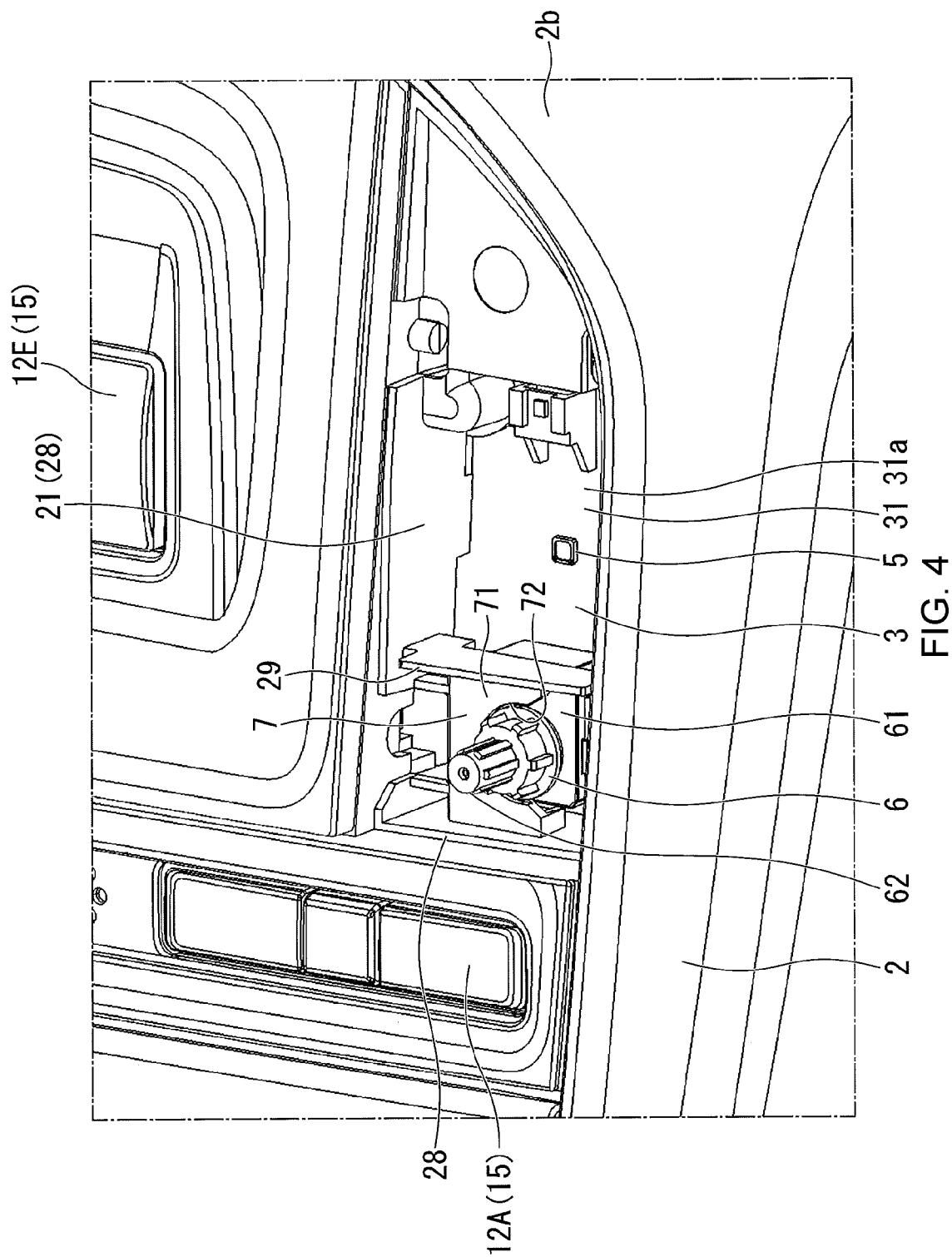
FIG. 4 is a perspective view of the room lamp according to the embodiment of the disclosure when seen from a lower surface side of a housing.

FIG. 2 is a perspective development view showing a configuration of the room lamp provided in the lighting device according to the embodiment of the disclosure. FIG. 3 is a perspective view showing a substrate forming the room lamp according to the embodiment of the disclosure. FIG. 4 is a perspective view of the room lamp according to the embodiment of the disclosure when seen from a lower surface side of a housing.

As shown in FIG. 2, the room lamp 11 of the lighting device 1 includes a substrate 3 fixed to an upper surface 2a of the housing 2 which faces the ceiling side, a cover member 4 provided on the upper surface 2a side of the housing 2 to press the substrate 3 toward the housing 2, and a switch cover 17 (refer to FIG. 1) provided on a lower surface 2b of the housing 2 which faces the passenger compartment side.

As shown in FIG. 3, the substrate 3 includes a plate-shaped substrate body 31 having a substantially L-shape in a plan view, a plurality of elements 32 forming an electronic circuit, a light emitting element 5 including a light emitting diode (LED) or the like, and an operation switch 6 which switches the light emitting element 5 on/off, for example.

As shown in FIGS. 3 and 4, the plurality of elements 32, the light emitting element 5, and the operation switch 6 are mounted on a surface 31a of the substrate body 31 which faces the passenger compartment side.

The operation switch 6 includes a body portion 61 which is fixed to the substrate 3, and a switch portion 62 which is capable of protruding and retracting with respect to the body portion 61.

A base portion 63 which has a substantially rectangular parallelepiped shape and is fixed to the surface 31a of the substrate 3 and a substantially cylindrical columnar portion 64 which extends from the base portion 63 toward the passenger compartment side are integrally provided in the body portion 61. A flange portion 65 which expands radially outward is formed on the outer circumferential surface of the columnar portion 64 to be parallel to a surface 63a of the base portion 63 with a space therebetween. Therefore, on the outer circumferential surface of the columnar portion 64, a groove-shaped concave portion 66 which is recessed radially inward and is continuous in a circumferential direction is formed between the flange portion 65 and the surface 63a of the base portion 63. The concave portion 66 is recessed in a direction intersecting a protruding and retracting direction Ds of the switch portion 62 which will be described later.

The switch portion 62 is provided to able to be made to protrude and retract in the direction Ds orthogonal to the surface 31a of the substrate body 31 of the substrate 3 with respect to the columnar portion 64 of the body portion 61. When an operator pushes the switch cover 17 and operates the switch portion 62 in the direction Ds in which the switch portion 62 protrudes and retracts relative to the columnar portion 64 of the body portion 61, the turning on/off of the light emitting element 5 is switched. In other words, the operation switch 6 is operated in the directions Ds of coming into contact with and moving away from the substrate 3 to switch the turning on/off of the light emitting element 5.

As shown in FIGS. 2 and 4, an opening 21 which passes through the upper surface 2a side and the lower surface 2b side is formed in the housing 2. The substrate 3 is disposed to follow the upper surface 2a of the housing 2 when a part of the outer circumferential surface of the substrate 3 comes into contact with a circumference of the opening 21. In addition, the substrate 3 is disposed inside the opening 21 so that the light emitting element 5 and the operation switch 6 face each other.

Figure 5:
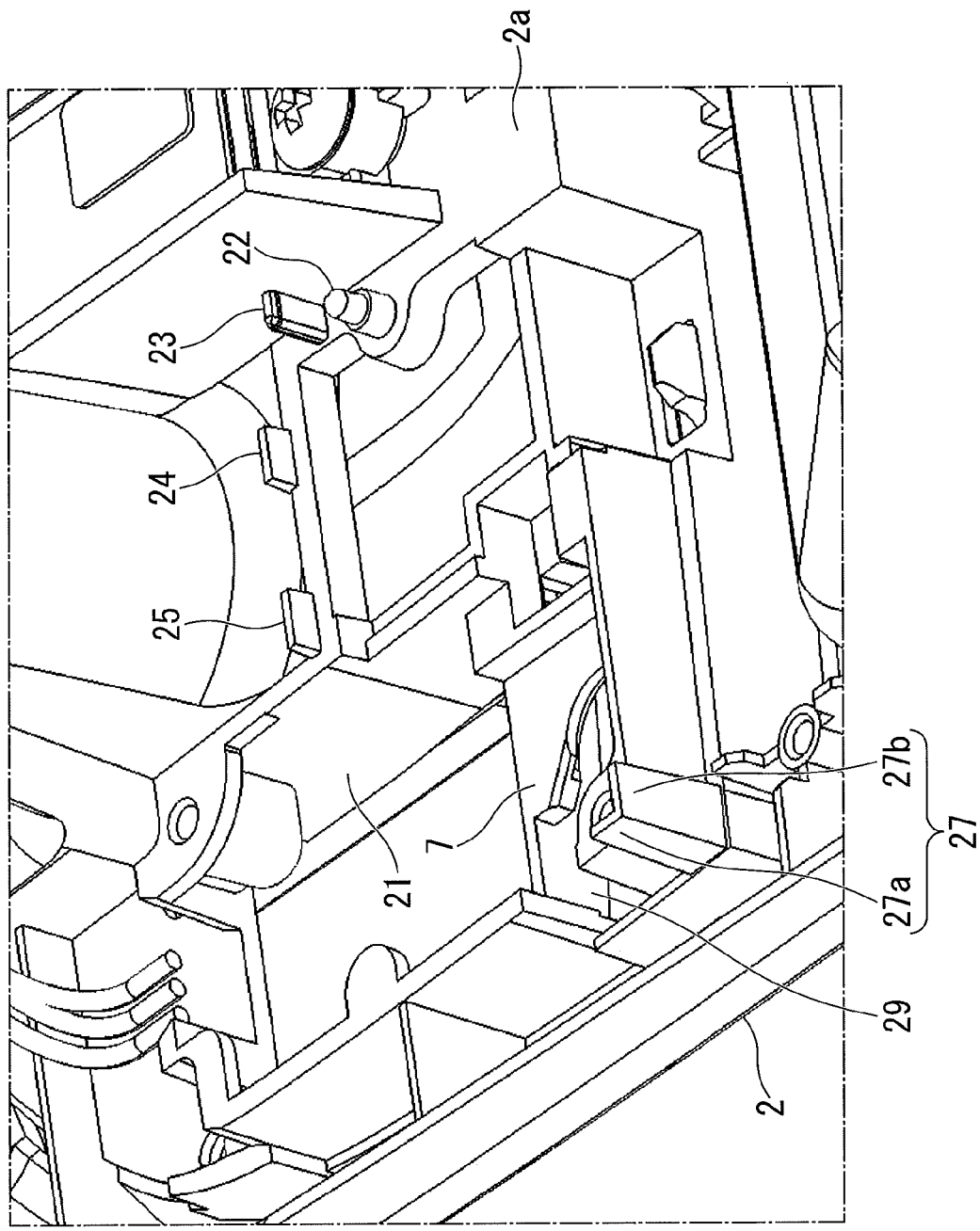
FIG. 5 is a perspective view of the housing according to the embodiment of the disclosure when seen from an upper surface side of the housing.
Figure 6:
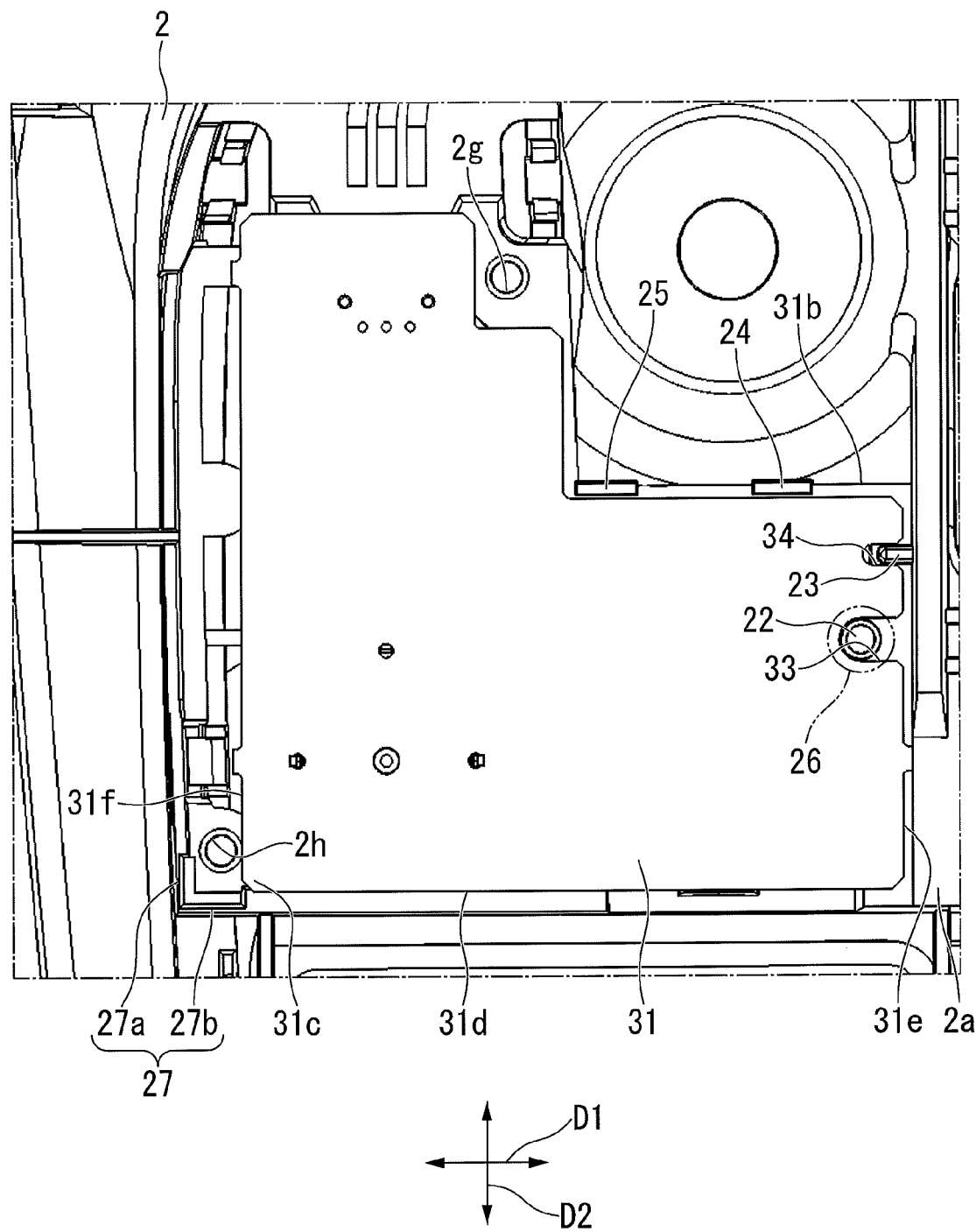
FIG. 6 is a plan view of the substrate according to the embodiment of the disclosure when seen from the upper surface side of the housing.
Figure 7:
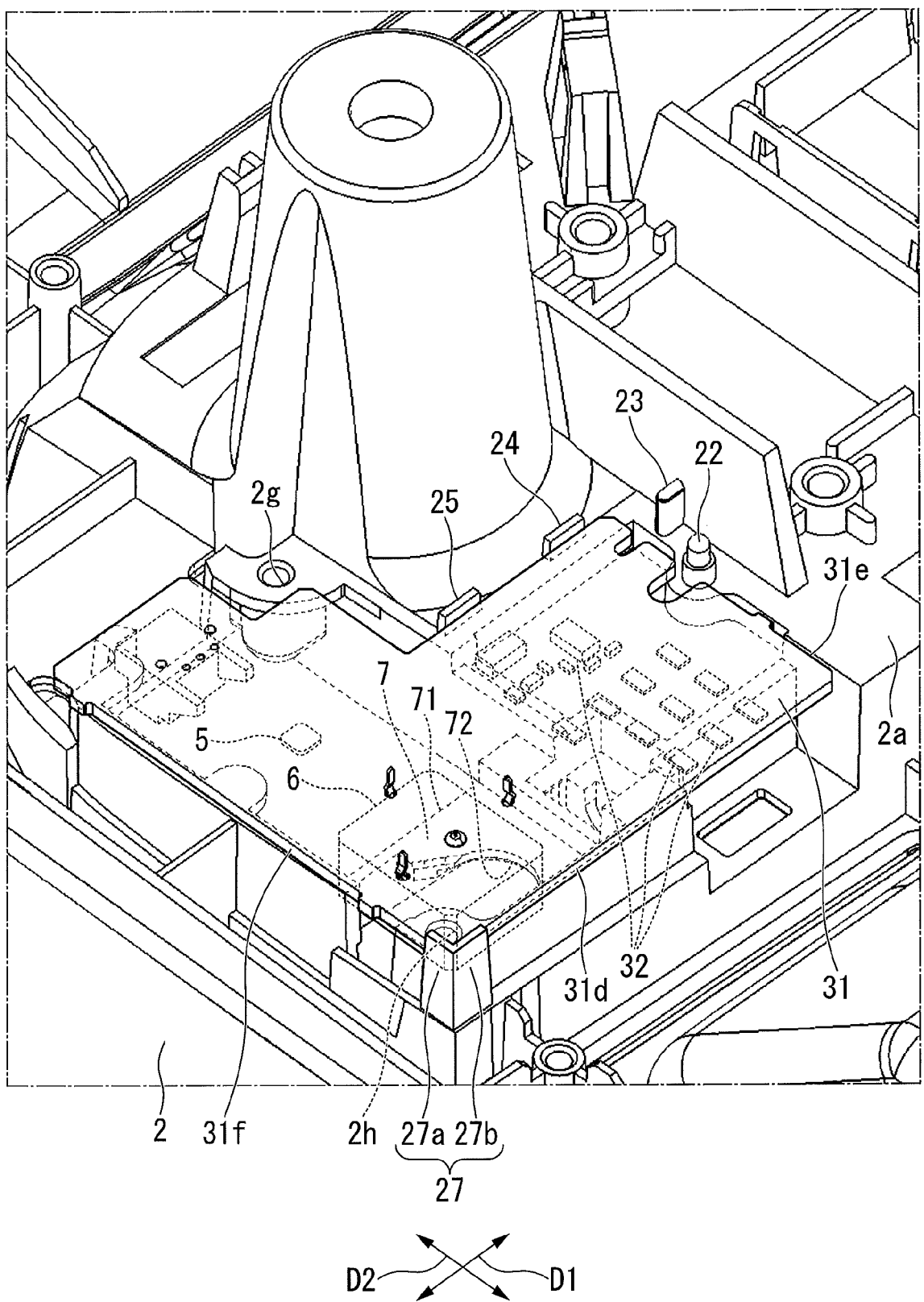
FIG. 7 is a perspective view showing one of procedures for installing the substrate in the housing according to the embodiment of the disclosure.

FIG. 5 is a perspective view of the housing according to the embodiment of the disclosure when seen from an upper surface side of the housing. FIG. 6 is a plan view of the substrate according to the embodiment of the disclosure when seen from the upper surface side of the housing. FIG. 7 is a perspective view showing one of procedures for installing the substrate in the housing according to the embodiment of the disclosure.

As shown in FIGS. 2, 5, and 6, in order to fix the substrate 3, substrate positioning portions 22, 23, 24 and 25 are formed on the upper surface 2a of the housing 2 to protrude from the upper surface 2a.

As shown in FIGS. 2 and 6, the substrate positioning portions 22 and 23 are inserted into recessed grooves 33 and 34 formed in a first end 31e of the substrate body 31. The recessed grooves 33 and 34 are formed to be recessed from the first end 33e of the substrate body 31 toward a second end 31f facing the first end 31e. The substrate positioning portions 22 and 23 are inserted into the recessed grooves 33 and 34 and restrict movement of the substrate body 31 in a direction D2 intersecting a direction D1 which connects the first end 31e and the second end 31f of the substrate body 31. Here, the substrate positioning portion 22 has a cylindrical shape, a male screw is formed at the tip end thereof, and the substrate body 31 can be fixed to the housing 2 by screwing a screw 26.

Further, the substrate positioning portions 24 and 25 are provided along a side edge 31b of the substrate body 31 extending in the direction D1 which connects the first end 31e with the second end 31f. The substrate positioning portions 24 and 25 restrict the movement of the substrate body 31 in the direction D2 which intersects the direction D1 which connects the first end 31e with the second end 31f and in which the substrate body 31 come into contact with the substrate positioning portions 24 and 25.

A guide portion 27 having an L shape in a plan view and having a first guide portion 27a and a second guide portion 27b orthogonal to the first guide portion 27a is formed on the upper surface 2a of the housing 2 in the vicinity of one corner 31c of the second end 31f of the substrate body 31. The first guide portion 27a of the guide portion 27 is formed with a predetermined interval in a direction of moving away from the first end 31e with respect to the second end 31f of the substrate body 31. The second guide portion 27b extends in the substrate body 31 in the direction D1 which connects the first end 31*e* with the second end 31*f* and is formed on the side of a side edge 31*d* facing the side edge 31*b*.

The guide portion 27 is used when the substrate 3 is assembled to the housing 2. Specifically, as shown in FIG. 7, when the substrate 3 is assembled to the housing 2, the substrate body 31 is caused to follow the upper surface 2*a* of the housing 2 in a state in which the corner 31*c* of the substrate body 31 is pressed against the first guide portion 27*a* and the second guide portion 27*b* of the guide portion 27. In this state, in the substrate body 31, the side edge 31*d* of the corner 31*c* is in contact with the second end 31*f* of the guide portion 27, and the side edge 31*b* is in contact with the substrate positioning portions 24 and 25.

Accordingly, the substrate body 31 is held in a state in which the movement thereof in the direction D2 intersecting the direction D1 connecting the first end 31*e* with the second end 31*f* is restricted. Further, in this state, the substrate positioning portions 22 and 23 are not completely inserted into the recessed grooves 33 and 34 of the first end 31*e* of the substrate body 31.

After that, as shown in FIGS. 2 and 6, when the substrate body 31 is moved toward the first end 31*e* along the upper surface 2*a* of the housing 2, the substrate positioning portions 22 and 23 are inserted into the recessed grooves 33 and 34. In this state, screw holes 2*h* and 2*g* for fixing the cover member 4 which will be described later are formed at two positions around the substrate body 31 in the upper surface 2*a* of the housing 2.

Figure 8:
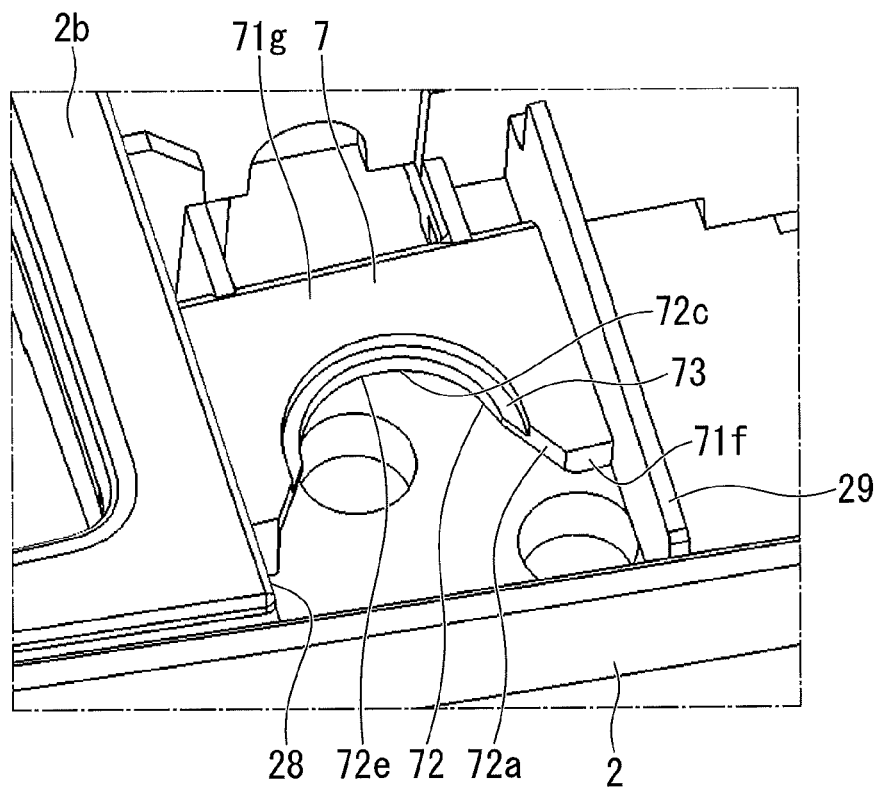
FIG. 8 is a perspective view showing a movement restricting portion formed in the housing according to the embodiment of the disclosure.
Figure 9:
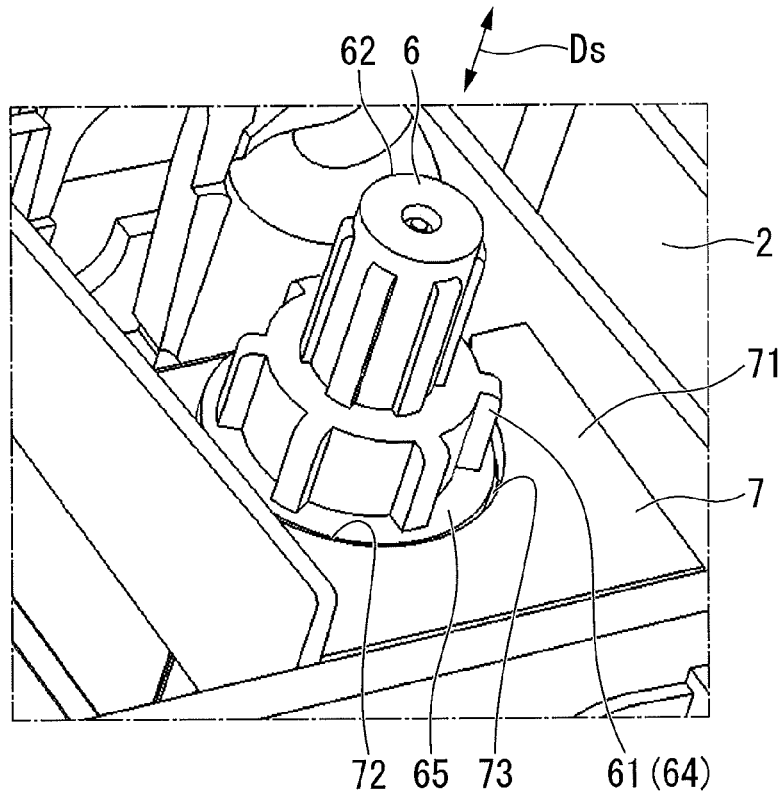
FIG. 9 is a perspective view showing a state in which a part of an operation switch is engaged with the movement restricting portion according to the embodiment of the disclosure.

FIG. 8 is a perspective view showing a movement restricting portion formed in the housing according to the embodiment of the disclosure. FIG. 9 is a perspective view showing a state in which a part of the operation switch is engaged with the movement restricting portion according to the embodiment of the disclosure.

As shown in FIGS. 4, 8 and 9, a movement restricting portion 7 which engages with a part of the operation switch 6 and restricts the movement of the operation switch 6 toward the substrate 3 side is formed on the lower surface 2*b* side of the housing 2. The movement restricting portion 7 includes a plate-shaped portion 71 formed to be parallel to the substrate 3, and a cutout portion 72 formed in the plate-shaped portion 71.

The plate-shaped portion 71 is formed to be thicker than a thickness of the housing 2 (for example, a second partition wall 29 or the like which will be described later) other than the plate-shaped portion 71.

The cutout portion 72 is formed at an end 71*f* of the plate-shaped portion 71 facing the second end 31*f* (refer to FIG. 7) side of the substrate body 31 and formed in a substantially U-shape in a plan view to be recessed from the end 71*f* toward the first end 31*e* side of the substrate body 31. Such a cutout portion 72 is recessed in a direction intersecting the protruding and retracting direction Ds (refer to FIG. 9) of the switch portion 62. Specifically, as shown in FIG. 8, an inner circumferential edge 72*e* of the cutout portion 72 includes an opening end 72*a* which is open in a direction intersecting the protruding and retracting direction Ds of the switch portion 62, and a curved portion 72*c* which continues to the opening end 72*a*.

Here, the opening end 72*a* and the inner circumferential edge 72*e* are formed to be wider than an outer diameter of the concave portion 66 of the operation switch 6. The opening end 72*a* is formed to be inclined, such that an opening dimension thereof in the width direction gradually enlarges as it is away from the curved portion 72*c*. Further, the curved portion 72*c* is formed with a curvature radius slightly larger than the outer diameter of the concave portion 66 of the operation switch 6. Also, in the plate-shaped portion 71, a concave step portion 73 is formed along the inner circumferential edge 72*e* of the cutout portion 72 with respect to a surface 71*g* of the plate-shaped portion 71 (a surface of the plate-shaped portion 71 on the side of the cover member 4).

Figure 10:
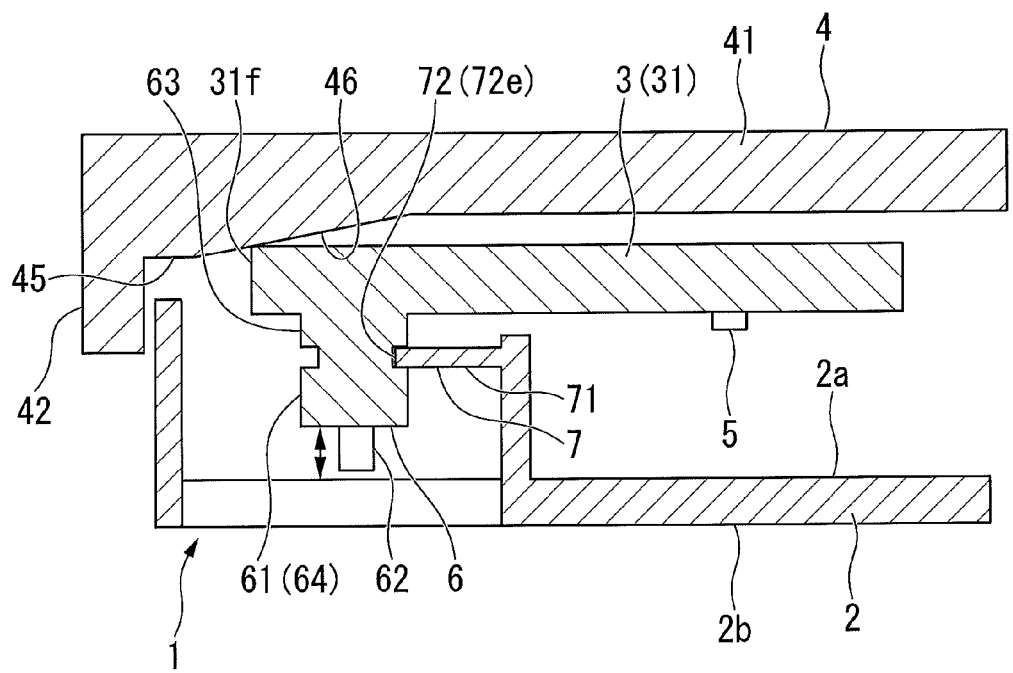
FIG. 10 is a cross-sectional view showing an engagement state between the movement restricting portion and the operation switch according to the embodiment of the disclosure.
Figure 11:
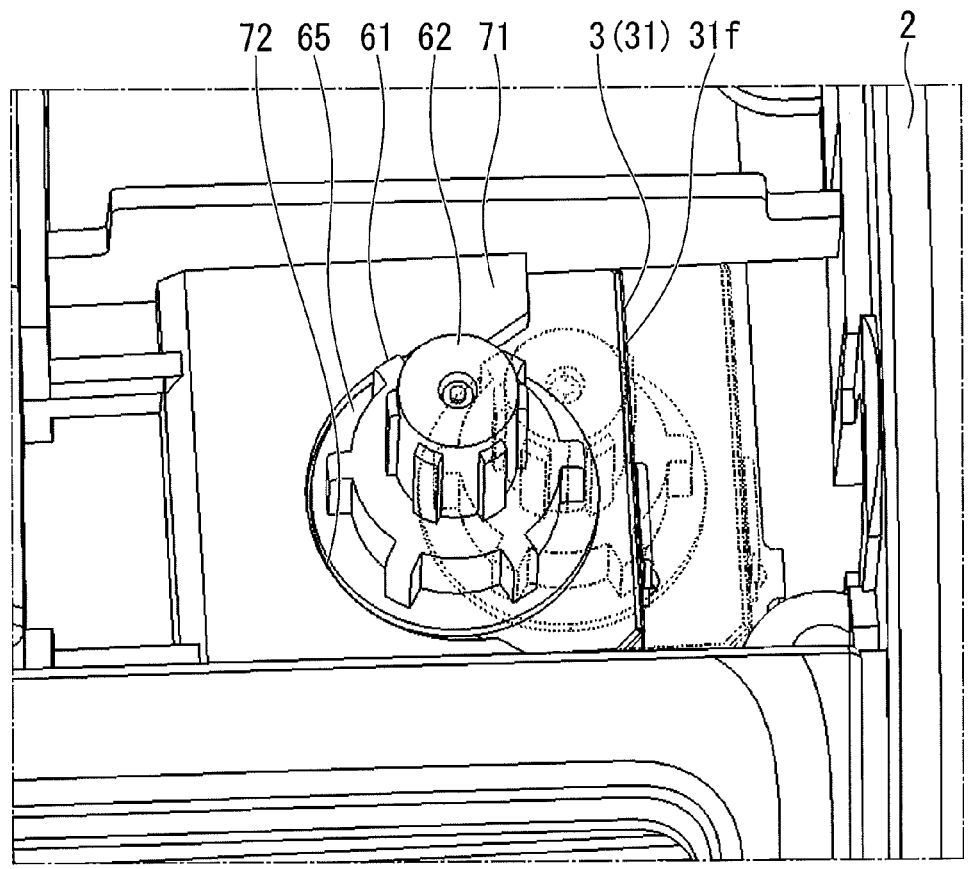
FIG. 11 is a perspective view showing a state in which a body portion of the operation switch according to the embodiment of the disclosure is inserted into a cutout portion of the movement restricting portion.

FIG. 10 is a cross-sectional view showing an engagement state between the movement restricting portion and the operation switch according to the embodiment of the disclosure. FIG. 11 is a perspective view showing a state in which the body portion of the operation switch according to the embodiment of the disclosure is inserted into the cutout portion of the movement restricting portion.

As shown in FIGS. 9 and 10, the inner circumferential edge 72*e* of such a cutout portion 72 is inserted into the concave portion 66 formed in the body portion 61 of the operation switch 6. As the movement restricting portion 7 formed in the housing 2 is inserted into the concave portion 66 formed in the body portion 61 of the operation switch 6, the movement restricting portion 7 engages with a part of the operation switch 6, and the movement of the body portion 61 of the operation switch 6 toward the substrate 3 side is restricted. Accordingly, even when the switch portion 62 of the operation switch 6 is operated in the directions Ds of coming into contact with and moving away from the substrate 3 to switch the light emitting element 5 on/off, an operation force of the operation switch 6 is minimized from being transmitted to the joint portion between the operation switch 6 and the substrate 3 or the substrate 3 via the operation switch 6.

Further, when the lighting device 1 is assembled, as shown in FIG. 11, the body portion 61 of the operation switch 6 is located on the side away from the cutout portion 72 in a state in which the corner 31*c* of the substrate body 31 of the substrate 3 is pressed against the first guide portion 27*a* and the second guide portion 27*b* of the guide portion 27 as described above. When the substrate body 31 is moved toward the first end 31*e* side, the concave portion 66 of the body portion 61 of the operation switch 6 enters the cutout portion 72 from the opening end 72*a* and comes into contact with the curved portion 72*c* of the inner circumferential edge 72*e*.

Therefore, as shown in FIG. 9, the body portion 61 of the operation switch 6 is supported by the movement restricting portion 7, and the movement of the body portion 61 toward the substrate 3 side is restricted. Further, since the opening end 72*a* and the inner circumferential edge 72*e* of the cutout portion 72 are wider than the outer diameter of the concave portion 66 of the operation switch 6, it is possible to minimize stress acting on the operation switch 6 from the cutout portion 72.

Further, in a state in which the body portion 61 of the operation switch 6 is inserted into the cutout portion 72, the step portion 73 is located on the outer circumferential side of the flange portion 65 of the operation switch 6. Therefore, an installation state of the operation switch 6 to the cutout portion 72 can be visually checked easily.

Figure 12:
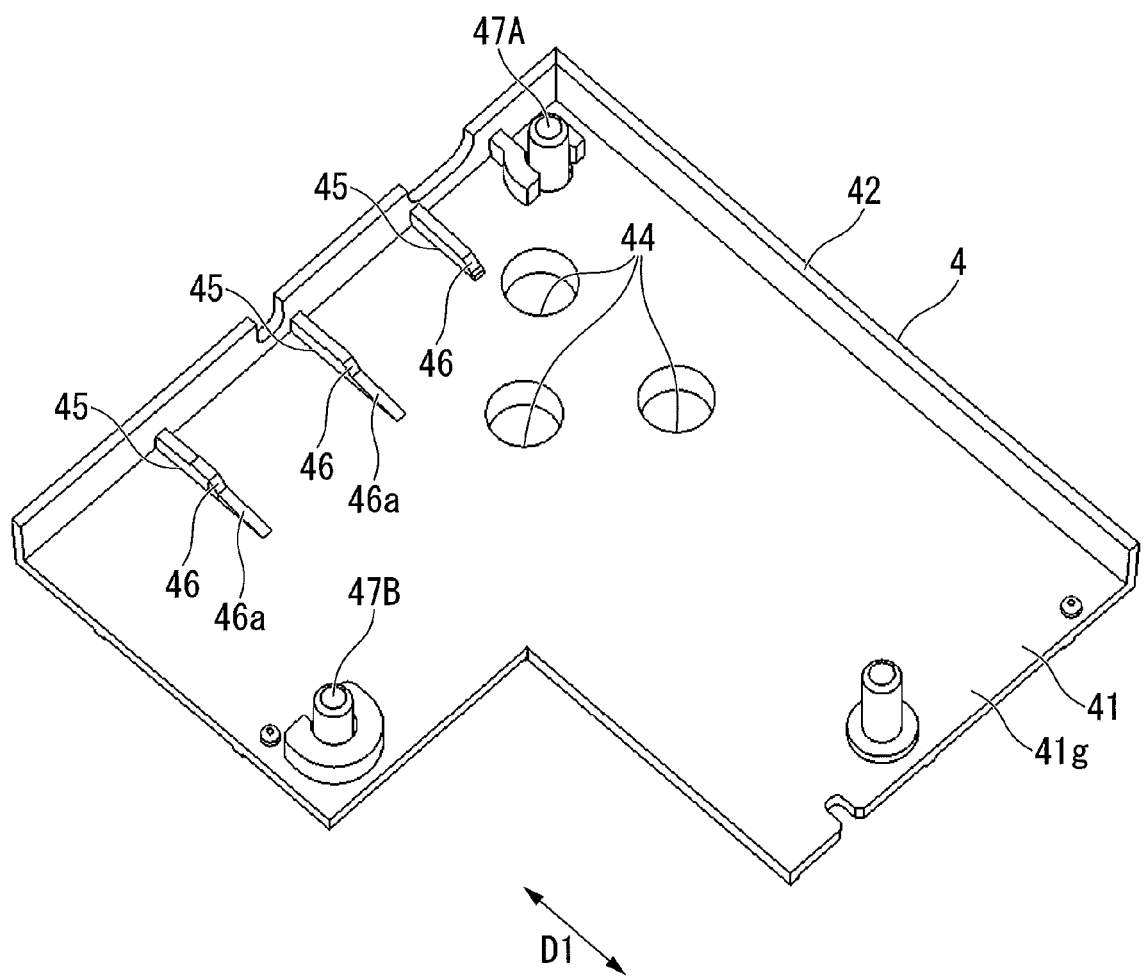
FIG. 12 is a perspective view showing a cover member according to the embodiment of the disclosure.
Figure 13:
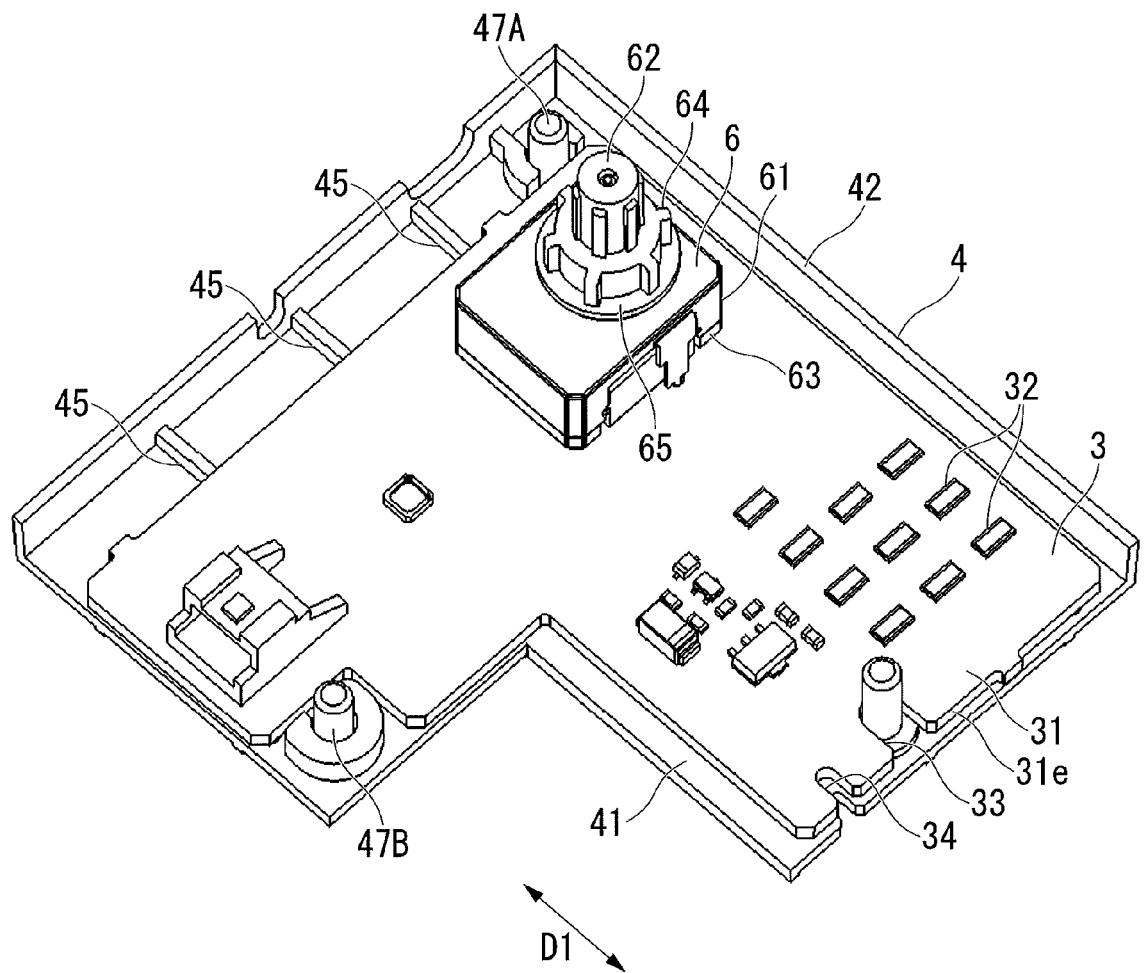
FIG. 13 is a perspective view showing a positional relationship between the substrate and the cover member in the embodiment of the disclosure.
Figure 14:
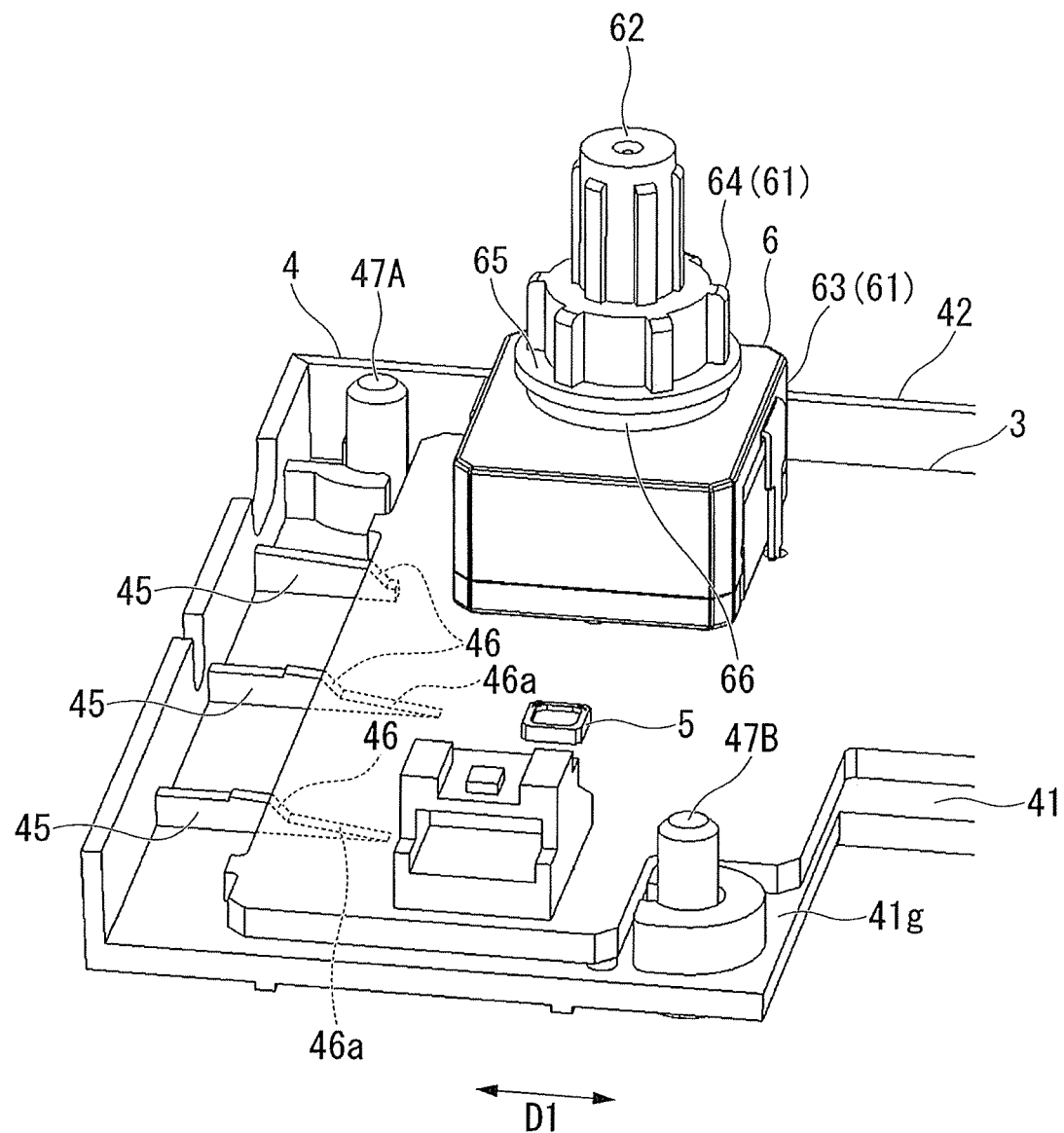
FIG. 14 is an enlarged perspective view showing the positional relationship between the substrate and the cover member in the embodiment of the disclosure.
Figure 15:
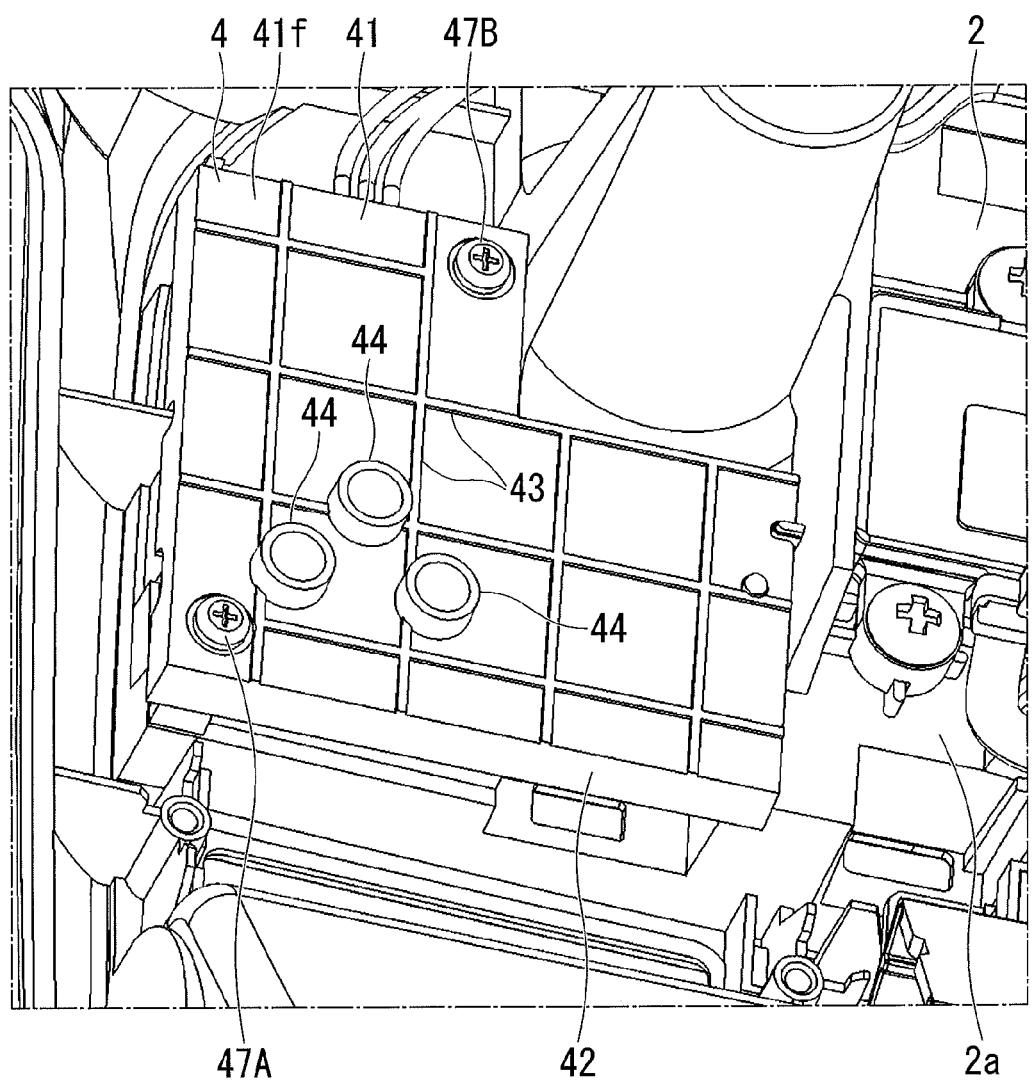
FIG. 15 is a perspective view showing a state in which the cover member according to the embodiment of the disclosure is fixed to the housing.

FIG. 12 is a perspective view showing the cover member according to the embodiment of the disclosure. FIG. 13 is a perspective view showing a positional relationship between the substrate and the cover member in the embodiment of the disclosure. FIG. 14 is an enlarged perspective view showing the positional relationship between the substrate and the cover member in the embodiment of the disclosure. FIG. 15 is a perspective view showing a state in which the cover member according to the embodiment of the disclosure is fixed to the housing.

As shown in FIGS. 12 to 15, the cover member 4 which presses down the substrate 3 integrally includes a plate-shaped portion 41 and a circumferential wall portion 42 which rises from the outer circumferential portion of the plate-shaped portion 41 toward the housing 2 side.

The plate-shaped portion 41 is formed to cover the entire substrate body 31 of the substrate 3, and ribs 43 for reinforcement are formed in a lattice shape on a surface 41f thereof away from the housing 2. In addition, a relief portion 44 for releasing a terminal of the operation switch 6 is formed in the plate-shaped portion 41.

In the cover member 4, a rib-shaped convex portion 45 which protrudes toward the substrate 3 is formed on a rear surface 41g of the plate-shaped portion 41 on the side facing the substrate 3. As shown in FIGS. 13 and 14, a plurality (for example, three) of convex portions 45 are formed on the cover member 4 on the second end 31f side of the substrate body 31 of the substrate 3. Each of the convex portions 45 is formed to extend in a direction in which the cutout portion 72 is recessed, in other words, in a direction D1 which connects the first end 31e with the second end 31f of the substrate 3. The convex portion 45 has an inclined portion 46 of which a protruding height from the cover member 4 gradually decreases as approaching the substrate 3 from the outer circumferential side of the substrate 3. In addition, in a part of the convex portion 45, the tip end of the inclined portion 46 further extends through a step. The extending tip end 46a is also formed so that a protruding height thereof gradually decreases toward the tip end. The tip end 46a serves to reinforce the cover member 4.

The cover member 4 is disposed to cover the substrate 3 disposed along the upper surface 2a of the housing 2. As shown in FIG. 15, the cover member 4 is fixed to the upper surface 2a of the housing 2 by fastening screws 47A and 47B into screw holes 2h and 2g (refer to FIG. 6). Therefore, the cover member 4 presses the substrate 3 from the side opposite to the housing 2 to sandwich the substrate 3 together with the housing 2.

In this state, as shown in FIGS. 10 and 14, the inclined portion 46 of the convex portion 45 formed on the cover member 4 is in contact with the second end 31f (outer circumferential end) of the substrate body 31 which is a part of the substrate 3. Therefore, in the substrate 3, movement of the substrate 3 in a direction in which the operation switch 6 comes out of the cutout portion 72 is restricted. At this time, the tip end 46a of the convex portion 45 does not come into contact with the substrate 3.

Also, as shown in FIGS. 4 and 8, a first partition wall 28 which forms an inner wall surface of the opening 21 and is provided along the outer circumferential portion of the substrate 3 is formed in the housing 2. The first partition wall 28 is located in a plane orthogonal to the surface 31a of the substrate 3 and is formed to surround the substrate 3.

Furthermore, in the housing 2, a second partition wall 29 is formed between the light emitting element 5 provided on the substrate 3 and the operation switch 6 provided on the substrate 3. The second partition wall 29 is located in a plane orthogonal to the surface 31a of the substrate 3 and is provided to partition the light emitting element 5 from the operation switch 6. Further, the plate-shaped portion 71 of the movement restricting portion 7 is provided between the second partition wall 29 and the first partition wall 28 facing the second partition wall 29 with the operation switch 6 interposed therebetween.

The first partition wall 28 prevents light from the light emitting element 5 provided on the substrate 3 from leaking from adjacent other operation switches 12A and 12E or the like. Also, the second partition wall 29 prevents the light from the light emitting element 5 from being reflected by the operation switch 6 or the like, returning to the light emitting element 5 side and forming and falling a shadow of the operation switch 6 on the switch cover 17.

As described above, the lighting device 1 includes the housing 2 which is installed in the vehicle, the substrate 3 which is fixed to the housing 2, the cover member 4 which is fixed to the housing 2 and presses down the substrate 3, the light emitting element 5 which is installed on the substrate 3, the operation switch 6 which is installed on the substrate 3 and switches the light emitting element 5 on/off by being operated in the directions of coming into contact with and moving away from the substrate 3, and the movement restricting portion 7 which is formed in the housing 2 and engages with a part of the operation switch 6 to restrict the movement of the operation switch 6 toward the substrate 3 side.

Due to such a configuration, the movement restricting portion 7 restricts the movement of the operation switch 6 toward the substrate 3 side. Therefore, when the operation switch 6 is operated in the directions of coming into contact with and moving away from the substrate 3 to switch the light emitting element 5 on/off, it is possible to minimize the operation force of the operation switch 6 being transmitted to the joint portion between the operation switch 6 and the substrate 3 or the substrate 3 via the operation switch 6. Accordingly, it is possible to minimize occurrence of cracks in the solder at the joint portion between the operation switch 6 and the substrate 3 or bending of the substrate 3.

Further, the number of screws 26 for fixing the substrate 3 to the housing 2 of the substrate 3 can be minimized by pressing down the substrate 3 fixed to the housing 2 with the cover member 4. Therefore, it is possible to reduce labor required for fixing the substrate 3 to the housing 2 and to reduce operation costs and component costs.

Furthermore, since the elements forming the circuit of the substrate 3 are covered with the cover member 4, it is possible to prevent the operator from touching the element or to prevent adhering of dust or the like from the outside to the circuit of the substrate 3 when the lighting device 1 is assembled to the vehicle. Also, when static electricity is generated, it is possible to prevent an influence thereof from being affected on the substrate 3 by providing the cover member 4.

Further, the operation switch 6 includes the body portion 61 fixed to the substrate 3, and the switch portion 62 capable of protruding and retracting with respect to the body portion 61. Additionally, the concave portion 66 recessed in the direction intersecting the protruding and retracting direction Ds of the switch portion 62 is provided in the body portion 61, and the movement restricting portion 7 is inserted into the concave portion 66.

Accordingly, the movement restricting portion 7 can engage with a part of the operation switch 6 and can restrict movement of the operation switch 6 toward the substrate 3. Additionally, it is possible to minimize the operation force of the operation switch 6 being transmitted to the joint portion between the operation switch 6 and the substrate 3 or the substrate 3 via the operation switch 6. Therefore, it is possible to improve durability of the lighting device 1.

Further, the movement restricting portion 7 includes the plate-shaped portion 71 which is formed to be parallel to the substrate 3, and the cutout portion 72 which is formed in the plate-shaped portion 71 and recessed in the direction intersecting with the protruding and retracting direction Ds of the switch portion 62. The inner circumferential edge 72e of the cutout portion 72 is inserted into the concave portion 66.

In this way, the movement of the operation switch 6 toward the substrate 3 side is restricted. At the time of assembly, since it is sufficient to fit the body portion 61 of the operation switch 6 into the cutout portion 72, assemblability of the lighting device 1 can be improved.

Further, the inner circumferential edge 72e of the cutout portion 72 has the opening end 72a which is open in the direction intersecting the protruding and retracting direction Ds of the switch portion 62. The opening end 72a and the inner circumferential edge 72e are formed to be wider than the outer diameter of the concave portion 66 of the operation switch 6.

Accordingly, when the body portion 61 of the operation switch 6 is fitted into the cutout portion 72, it is possible to minimize stress acting on the operation switch 6 from the cutout portion 72. Therefore, it is possible to minimize the stress acting on the joint between the operation switch 6 and the substrate 3 via the operation switch 6.

Furthermore, the step portion 73 which is recessed with respect to the surface of the plate-shaped portion 71 is formed along the inner circumferential edge 72e of the cutout portion 72.

Accordingly, when the inner circumferential edge 72e of the cutout portion 72 is inserted into the concave portion 66 of the operation switch 6, the step portion 73 is located on the outer circumferential side of the body portion 61 of the operation switch 6. Therefore, it is possible to visually check the installation state of the operation switch 6 with respect to the cutout portion 72 easily.

Further, the lighting device 1 further includes the substrate positioning portions 22, 23, 24 and 25 which are formed in the housing 2 and are in contact with the substrate 3 in the direction D2 intersecting the direction in which the cutout portion 72 is recessed.

In this way, by the substrate positioning portions 22, 23, 24 and 25 coming into contact with the substrate 3, position displacement of the substrate 3 in the direction D2 intersecting the direction in which the cutout portion 72 is recessed can be minimized.

Further, the plate-shaped portion 71 is formed to be thicker than the thickness of the housing 2 (for example, the second partition wall 29 or the like which will be described later) other than the plate-shaped portion 71. Therefore, since necessary rigidity can be ensured only at necessary portions of the housing 2, the material cost of the housing 2 can be reduced. Also, since the entire housing 2 is not made thick, deformation due to thermal sink or the like of the housing 2 can be minimized when the housing 2 is resin-molded.

Further, the cover member 4 has the convex portion 45 which protrudes toward the substrate 3 and restricts the substrate 3 by coming into contact with a part of the substrate 3. In this way, since the convex portion 45 can restrict the substrate 3 by coming into contact with a part of the substrate 3, the number of screws 26 for fixing the substrate 3 to the housing 2 can be reduced in this respect.

Further, the convex portion 45 has the inclined portion 46 which extends along the recessed direction of the cutout portion 72 and has the protruding height gradually decreasing from the cover member 4 as approaching the substrate 3 from the outer circumferential side of the substrate 3. Additionally, as the outer circumferential end of the substrate 3 comes into contact with the inclined portion 46, the movement of the substrate 3 in the direction in which the operation switch 6 comes out of the cutout portion 72 is restricted. As described above, rattling of the substrate 3 in the direction in which the operation switch 6 comes out of the cutout portion 72 is restricted by the outer circumferential end of the substrate 3 coming into contact with the inclined portion 46 of the convex portion 45 formed on the cover member 4.

Also, the lighting device 1 further includes the first partition wall 28 formed in the housing 2 and provided along the outer circumferential portion of the substrate 3. Therefore, due to the first partition wall 28, it is possible to prevent the light from the light emitting element 5 provided on the substrate 3 from leaking from the other operation switches 12A and 12E and so on formed in the housing 2.

In addition, the lighting device 1 further includes a second partition wall 29 which is formed in the housing 2 and disposed between the light emitting element 5 provided on the substrate 3 and the operation switch 6 provided on the substrate 3. Therefore, due to the second partition wall 29, it is possible to prevent the light from the light emitting element 5 from being reflected by the operation switch 6 or the like and to prevent the shadow or the like of the operation switch 6 from being formed.

OTHER EMBODIMENTS

The disclosure is not limited to each of the above-described embodiments and includes various modifications to the above-described embodiment within the scope not deviating from the gist of the disclosure.

For example, in the above-described embodiment, the configuration of the disclosure has been applied to the room lamp 11, but the same configuration may be applied to the other operation switches 12A to 12E and so on.

Further, the configuration of the lighting device 1 shown in the above-described embodiment is merely an example, and the shape and appearance thereof, and the switches and lamps that are equipped can be appropriately changed.

Further, in the above-described embodiment, the example in which the lighting device 1 is used as the room lamp 11 of the vehicle has been described, but the disclosure is not limited to this example. For example, it is also possible to use the lighting device 1 at other places, for example, inside a building.

Besides this, as long as it does not depart from the gist of the disclosure, it is possible to select the configuration described in the above-described embodiment or to appropriately change to other configurations.

What is claimed is:
1. A lighting device comprising:
a housing installed in a vehicle;
a substrate fixed to the housing;
a cover member which is fixed to the housing, sandwiches the substrate together with the housing and presses the substrate from an opposite side to the housing;
a light emitting element installed on the substrate;
an operation switch which is installed on the substrate to protrude toward the housing and switches the light emitting element on/off by being operated in directions of coming into contact with and moving away from the substrate; and
a movement restricting portion which is formed as one piece with the housing, engages with a part of the operation switch and restricts movement of the operation switch toward the substrate side,
wherein the operation switch comprises a body portion which is fixed to the substrate and a switch portion which is capable of protruding and retracting with respect to the body portion, a concave portion recessed in a direction intersecting a protruding and retracting direction of the switch portion is provided in the body portion, and the movement restricting portion is inserted into the concave portion, wherein the movement restricting portion comprises a plate-shaped portion which is formed to be parallel to the substrate and a cutout portion which is formed in the plate-shaped portion and recessed in the direction intersecting the protruding and retracting direction of the switch portion, and an inner circumferential edge of the cutout portion is inserted into the concave portion, wherein the cover member comprises a convex portion which protrudes toward the substrate, wherein the convex portion has an inclined portion which extends in the recessed direction of the cutout portion and of which a protruding height from the cover member gradually decreases as the substrate is approached from an outer circumferential side of the substrate, wherein, in an operating direction of the operation switch, the substrate is sandwiched between the movement restricting portion and the inclined portion, and a contact portion of the inclined portion and the substrate is disposed toward an opening direction side of the cutout portion relative to the operation switch.

2. The lighting device according to claim 1, wherein the inner circumferential edge of the cutout portion has an opening end which is open in the direction intersecting the protruding and retracting direction of the switch portion, and the opening end and the inner circumferential edge are formed to be wider than an outer diameter of the concave portion of the operation switch.

3. The lighting device according to claim 2, wherein a step portion which is recessed with respect to a surface of the plate-shaped portion is formed along the inner circumferential edge of the cutout portion.

4. The lighting device according to claim 2, further comprising a substrate positioning portion which is formed in the housing and comes into contact with the substrate in a direction intersecting a recessed direction of the cutout portion.

5. The lighting device according claim 2, further comprising a first partition wall which is formed in the housing and provided along an outer circumferential portion of the substrate.

6. The lighting device according to claim 1, wherein a step portion which is recessed with respect to a surface of the plate-shaped portion is formed along the inner circumferential edge of the cutout portion.

7. The lighting device according to claim 6, further comprising a substrate positioning portion which is formed in the housing and comes into contact with the substrate in a direction intersecting a recessed direction of the cutout portion.

8. The lighting device according claim 6, further comprising a first partition wall which is formed in the housing and provided along an outer circumferential portion of the substrate.

9. The lighting device according to claim 1, further comprising a substrate positioning portion which is formed in the housing and comes into contact with the substrate in a direction intersecting a recessed direction of the cutout portion.

10. The lighting device according claim 1, further comprising a first partition wall which is formed in the housing and provided along an outer circumferential portion of the substrate.

11. The lighting device according to claim 10, further comprising a second partition wall which is formed in the housing and disposed between the light emitting element provided on the substrate and the operation switch provided on the substrate.

* * * * *